(12) United States Patent
Liang et al.

(10) Patent No.: US 10,991,572 B2
(45) Date of Patent: Apr. 27, 2021

(54) MANUFACTURING METHOD FOR SEMICONDUCTOR APPARATUS

(71) Applicants: Semiconductor Manufacturing International (Shanghai) Corporation, Shanghai (CN); Semiconductor Manufacturing International (Beijing) Corporation, Beijing (CN)

(72) Inventors: Jin E Liang, Shanghai (CN); Le Lv, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/044,795

(22) Filed: Jul. 25, 2018

(65) Prior Publication Data

US 2019/0057861 A1 Feb. 21, 2019

(30) Foreign Application Priority Data

Aug. 21, 2017 (CN) .......................... 201710717380.4

(51) Int. Cl.
| | | |
|---|---|---|
| *H01L 21/3213* | (2006.01) | |
| *C23F 1/00* | (2006.01) | |
| *H01L 21/02* | (2006.01) | |
| *H01L 23/532* | (2006.01) | |
| *H01L 21/768* | (2006.01) | |
| *H01L 21/306* | (2006.01) | |
| *H01L 21/3105* | (2006.01) | |
| *H01L 21/28* | (2006.01) | |

(52) U.S. Cl.
CPC .. *H01L 21/02274* (2013.01); *H01L 21/02164* (2013.01); *H01L 21/28* (2013.01);
(Continued)

(58) Field of Classification Search
CPC .............. H01L 21/3205; H01L 21/321; H01L 21/32115; H01L 21/3212; H01L 21/3213;
(Continued)

(56) References Cited

U.S. PATENT DOCUMENTS 6,001,716 A 12/1999 Liao
6,376,358 B1 * 4/2002 Fischer ............. H01L 21/76889
257/E21.507

(Continued)

*Primary Examiner* — Thomas T Pham
(74) *Attorney, Agent, or Firm* — Brinks Gilson & Lione

(57) ABSTRACT

The present disclosure discloses a manufacturing method for a semiconductor apparatus, and relates to the field of semiconductor technologies. Forms of the method include: providing a semiconductor structure, where the semiconductor structure includes: a substrate and an interlayer dielectric layer on the substrate, where the interlayer dielectric layer has an opening for forming a gate; depositing a gate metal layer on the semiconductor structure to fill the opening, where the gate metal layer contains impurity; forming an impurity adsorption layer on the gate metal layer; performing a first annealing treatment on a semiconductor structure on which the impurity adsorption layer has been formed, to make the impurity in the gate metal layer enter the impurity adsorption layer; and removing the impurity adsorption layer after the first annealing treatment is performed. The present disclosure may reduce impurity in the gate metal layer, thereby improving contact resistance of the gate and improving device performance.

14 Claims, 8 Drawing Sheets

(52) U.S. Cl.
CPC .. *H01L 21/28079* (2013.01); *H01L 21/30604* (2013.01); *H01L 21/31055* (2013.01); *H01L 21/76832* (2013.01); *H01L 23/53219* (2013.01)

(58) Field of Classification Search
CPC ......... H01L 21/32131; H01L 21/32133; H01L 21/32134; H01L 21/32135; C23F 1/00; C23F 1/02
See application file for complete search history.

(56) References Cited

U.S. PATENT DOCUMENTS

| | | | | |
|---|---|---|---|---|
| 2005/0136579 | A1* | 6/2005 | Hao | H01L 21/28035 |
| | | | | 438/197 |
| 2009/0278209 | A1* | 11/2009 | Noda | H01L 29/6653 |
| | | | | 257/408 |
| 2011/0027988 | A1* | 2/2011 | Hwang | H01L 21/743 |
| | | | | 438/656 |
| 2011/0089513 | A1* | 4/2011 | Endo | H01L 27/1463 |
| | | | | 257/431 |
| 2011/0275215 | A1* | 11/2011 | Gatineau | C07F 17/00 |
| | | | | 438/681 |
| 2012/0252180 | A1 | 10/2012 | Tomimatsu et al. | |
| 2014/0213028 | A1* | 7/2014 | Liang | H01L 21/823418 |
| | | | | 438/275 |
| 2016/0322462 | A1* | 11/2016 | Chou | H01L 21/30604 |
| 2017/0110375 | A1* | 4/2017 | Bao | H01L 21/823842 |
| 2017/0141231 | A1* | 5/2017 | Matsumoto | H01L 21/383 |
| 2017/0148686 | A1* | 5/2017 | Bao | H01L 21/823828 |
| 2018/0019340 | A1* | 1/2018 | Adusumilli | H01L 29/7851 |
| 2018/0040713 | A1* | 2/2018 | Chang | H01L 21/823431 |
| 2018/0158954 | A1* | 6/2018 | Matsumoto | H01L 29/78696 |

\* cited by examiner

MANUFACTURING METHOD FOR SEMICONDUCTOR APPARATUS

RELATED APPLICATIONS

The present application claims priority to Chinese Patent Appln. No. 201710717380.4, filed Aug. 21, 2017, the entire disclosure of which is hereby incorporated by reference.

BACKGROUND

Technical Field

The present disclosure relates to the field of semiconductor technologies, and in particular, to a manufacturing method for a semiconductor apparatus.

Related Art

As a critical dimension (CD for short) of semiconductor devices gradually decreases, a silicon-titanium compound (such as titanium silicide (TiSix)) is introduced to a contact glue layer. In an existing manufacturing procedure, after contact holes of a source, a drain, and a metal gate are formed, a glue layer is formed on the bottom and side walls of these contact holes. For example, the glue layer may be titanium (Ti) or titanium nitride (TiN). Then, an annealing treatment is performed, so that a silicon-titanium compound is formed on a glue layer part in which surface parts of the source and the drain are in contact. Then, a source contact, a drain contact, and a gate contact for filling these contact holes are formed. These contacts may be made from tungsten.

However, a metal gate and a gate contact of a semiconductor device manufactured by means of the foregoing process have a contact issue therebetween. FIG. 1 is a cross sectional view of an example of a connection structure of a metal gate and a gate contact in the prior art. For example, as shown in FIG. 1, there is a void 15 in a glue layer 14 between the metal gate 11 and the gate contact 12 (the gate contact is surrounded by a silicon dioxide ($TiO_2$) layer 13). Consequently, contact resistance of the gate is relatively high.

SUMMARY

It is found by the inventor of the present disclosure that there is a void in a glue layer between a metal gate and a gate contact in the prior art. Consequently, contact resistance of a gate is relatively high, thereby affecting device performance.

It is found by the inventor of the present disclosure in further research that impurity (such as fluorine) that generally enters the glue layer from the metal gate appears in the glue layer, and reacts with Ti in the glue layer to form a compound, thereby forming the void.

A technical problem that needs to be addressed in the present disclosure is to provide a manufacturing method for a semiconductor apparatus, to reduce content of impurity in a metal gate, thereby reducing content of impurity that enters a glue layer from the metal gate.

In one aspect of the present disclosure, a manufacturing method for a semiconductor apparatus is provided, including: providing a semiconductor structure, where the semiconductor structure includes: a substrate and an interlayer dielectric layer on the substrate, where the interlayer dielectric layer has an opening for forming a gate; depositing a gate metal layer on the semiconductor structure to fill the opening, where the gate metal layer contains impurity; forming an impurity adsorption layer on the gate metal layer; performing a first annealing treatment on a semiconductor structure on which the impurity adsorption layer has been formed, to make the impurity in the gate metal layer enter the impurity adsorption layer; and removing the impurity adsorption layer after the first annealing treatment is performed.

In some implementations, in the step of depositing a gate metal layer, the gate metal layer includes: a first part in the opening and a second part on the first part, where the second part is further formed on the interlayer dielectric layer; and before forming the impurity adsorption layer, the method further includes: removing a portion of the second part by means of a planarization process or an etchback process, so as to thin the second part.

In some implementations, after the portion of the second part is removed, a thickness of a remaining portion of the second part falls within a range of 100 Å to 300 Å.

In some implementations, the impurity adsorption layer is removed by means of the planarization process; and in the step of removing the impurity adsorption layer, the remaining portion of the second part, a part of the interlayer dielectric layer, and a portion of the first part are further removed, where a remaining part of the first part is used as the metal gate.

In some implementations, a material of the gate metal layer includes tungsten; the impurity includes fluorine; and a material of the impurity adsorption layer includes Ti or a titanium-aluminum (TiAl) alloy.

In some implementations, a thickness of the impurity adsorption layer falls within a range of 500 Å to 700 Å.

In some implementations, the first annealing treatment includes a dynamic surface annealing (DSA) process or a rapid thermal annealing process.

In some implementations, a temperature of the first annealing treatment falls within a range of is 800° C. to 1000° C.

In some implementations, before performing the first annealing treatment, the method further includes: forming an antioxidation layer on the impurity adsorption layer; and in the step of removing the impurity adsorption layer, the antioxidation layer is further removed.

In some implementations, a material of the antioxidation layer includes TiN.

In some implementations, a thickness of the antioxidation layer falls within a range of 20 Å to 50 Å.

In some implementations, the opening exposes a part of a surface of the substrate; and in the step of providing a semiconductor structure, the semiconductor structure further includes: a spacer layer on a side wall of the opening, an interface layer that is on an exposed surface of the substrate in the opening and on the side wall of the spacer layer, a high-k dielectric layer on the interface layer, and a barrier layer on the high-k dielectric layer, where the gate metal layer is formed on the barrier layer.

In some implementations, the substrate includes: a semiconductor layer, a semiconductor fin on the semiconductor layer, and a trench isolation portion on the semiconductor layer around the semiconductor fin, where the interlayer dielectric layer is formed on the semiconductor fin and the trench isolation portion.

In some implementations, in the step of providing a semiconductor structure, the semiconductor structure further includes: a source and a drain that are respectively on two sides of the opening and at least partially located in the substrate, where the interlayer dielectric layer further covers the source and the drain.

In some implementations, the method further includes: forming an insulator layer on the interlayer dielectric layer; patterning the insulator layer to form a source contact hole exposing the source, a drain contact hole exposing the drain, and a gate contact hole exposing the gate; forming a glue layer on side walls and the bottom of the source contact hole, the drain contact hole, and the gate contact hole; performing a second annealing treatment, so that parts of the glue layers on the bottom of the source contact hole and the drain contact hole are respectively combined with surface parts of the source and the drain to form silicide layers; and forming a source contact on the silicide layer of the source contact hole, forming a drain contact on the silicide layer of the drain contact hole, and forming a gate contact on the glue layer of the gate contact hole.

In the foregoing manufacturing method, the impurity adsorption layer is formed on the gate metal layer after the gate metal layer is formed. Then, the first annealing treatment is performed, to make the impurity in the gate metal layer enter the impurity adsorption layer, and the impurity adsorption layer is removed. Therefore, undesired impurity in the gate metal layer can be removed as much as possible, reducing content of the impurity in the metal gate, thereby reducing content of impurity that enters the glue layer from the metal gate.

Further, after the glue layer is subsequently formed, generally, none of the impurity enters the glue layer from the metal gate to form a void, thereby enabling contact resistance between the metal gate and the subsequently formed gate contact to be relatively low, thereby improving device performance.

Other features of the present disclosure and advantages thereof will become apparent from the following detailed description of exemplary embodiments and implementations according to the present disclosure with reference to the accompanying drawings.

BRIEF DESCRIPTION OF THE DRAWINGS

The accompanying drawings, which are incorporated in and constitute a part of the specification, illustrate embodiments and implementations of the present disclosure and, together with the description, serve to explain the principles of the disclosure.

With reference to the accompanying drawings, a more clear understanding of the present disclosure may be obtained from the following description.

DETAILED DESCRIPTION

Figure 1:
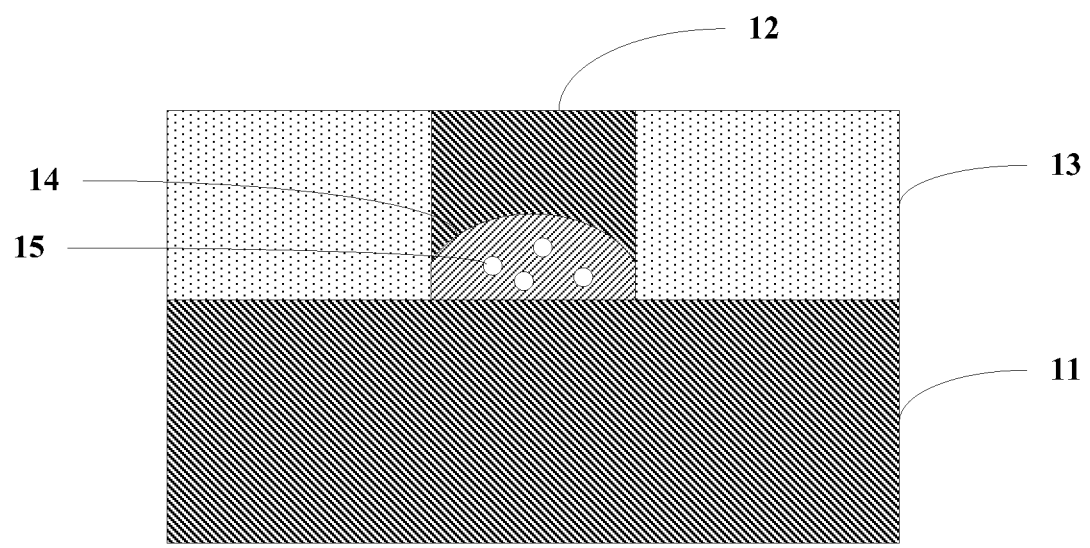
FIG. 1 is an exemplarily cross sectional view of a connection structure of a metal gate and a gate contact in the prior art.

Various exemplary embodiments and implementations of the present disclosure will now be described in detail with reference to the accompanying drawings. It should be noted that the relative arrangement of the components and steps, the numerical expressions, and numerical values set forth in these embodiments and implementations do not limit the scope of the present disclosure unless it is specifically stated otherwise.

Meanwhile, it should be appreciated that for the convenience of description, various parts shown in the accompanying drawings are not necessarily drawn on scale.

The following description of at least one exemplary embodiment is merely illustrative in nature and is in no way intended to limit the present disclosure, its application, or uses.

Techniques, methods, and apparatus as known by a person of ordinary skills in the relevant art may not be discussed in detail but are intended to be a part of the specification where appropriate.

In all of the examples illustrated and discussed herein, any specific values should be interpreted to be illustrative only and non-limiting. Therefore, other examples of the exemplary embodiments and implementations could have different values.

It should be noted that similar reference numerals and letters refer to similar items in the following figures, and thus, once an item is defined in one figure, it is possible that it needs not to be further discussed for the following figures.

As shown in FIG. 1, it is found by the inventor of the present disclosure that a glue layer 14 between a metal gate (such as tungsten) 11 and a gate contact (such as tungsten) 12 is incomplete, such as a Ti component, and has a void 15 therebetween. It is found in further research that there is a fluorine element in the glue layer. Consequently, contact resistance of the gate is relatively high due to the void.

Currently, a tungsten deposition process is usually used to form a metal gate, that is, form a tungsten gate. For example, a nucleation layer of the metal gate may be formed by using $B_2H_6$ and $WF_6$ by means of an atomic layer deposition (ALD for short) process, and a chemical reaction thereof is as follows: $B_2H_6+WF_6(ALD)\rightarrow W+BF_3+HF$. Then, optionally, a surface of the nucleation layer may be processed by using $B_2H_6$. Next, a hole filling operation is performed by means of a reaction between $H_2$ and $WF_6$ to form the tungsten gate (that is, the metal gate), and the chemical reaction thereof is as follows: $H_2+WF_6\rightarrow W+HF$. It is found by the inventor of the present disclosure that because $WF_6$ is used as a reactive gas during the reaction of the deposition for the tungsten gate, a formed tungsten layer may be doped with a fluorine element.

In a subsequent manufacturing process, contact holes of a source, a drain, and the tungsten gate need to be formed, and a glue layer is formed on the bottom and side walls of these contact holes. For example, the glue layer may be Ti or TiN. Then, an annealing treatment is performed, so that a silicon-titanium compound (such as TiSix) is formed on a glue layer part in which surface parts of the source and the drain are in contact. Then, a source contact, a drain contact, and a gate contact for filling these contact holes are formed. In the procedure, a fluorine element mainly from the tungsten gate is probably diffused to the glue layer of the tungsten gate, and reacts with a Ti element in the glue layer, so that a gas compound is probably formed, resulting in presence of a void in the glue layer. Consequently, contact resistance of the gate and the gate contact is relatively high due to the void, thereby affecting device performance.

Figure 2:
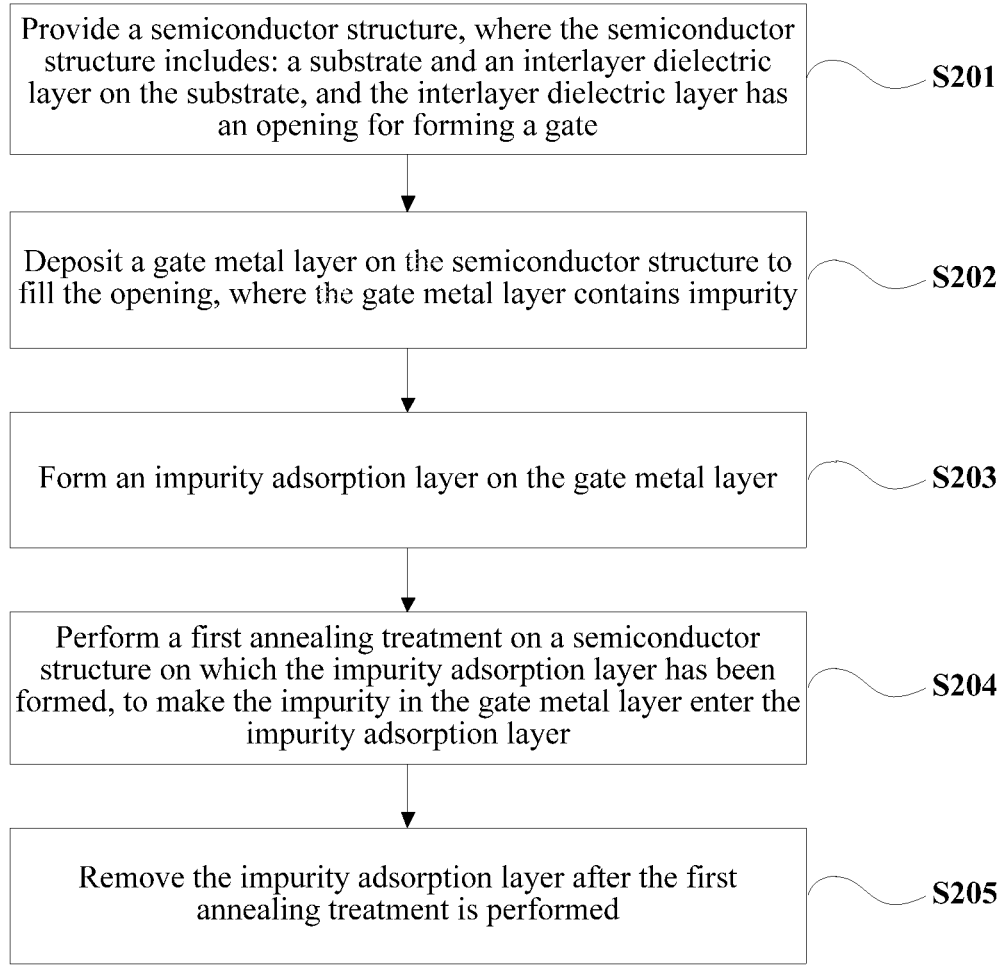
FIG. 2 is a flowchart of a manufacturing method for a semiconductor apparatus.

FIG. 2 is a flowchart of a manufacturing method for a semiconductor apparatus.

Step S201. Provide a semiconductor structure, where the semiconductor structure includes: a substrate and an interlayer dielectric layer on the substrate, where the interlayer dielectric layer has an opening for forming a gate.

In some implementations, the opening may expose a part of a surface of the substrate. In step S201, the semiconductor structure may further include: a spacer layer on a side wall of the opening, an interface layer that is on an exposed surface of the substrate in the opening and on the side wall of the spacer layer, a high-k dielectric layer on the interface layer, and a barrier layer on the high-k dielectric layer.

In some implementations, the substrate may include: a semiconductor layer, a semiconductor fin on the semiconductor layer, and a trench isolation portion (such as a shallow trench isolation (STI) on the semiconductor layer around the semiconductor fin. The interlayer dielectric layer is formed on the semiconductor fin and the trench isolation portion.

In some implementations, in step S201, the semiconductor structure may further include: a source and a drain that are respectively on two sides of the opening and at least partially located in the substrate. The interlayer dielectric layer may further cover the source and the drain.

Step S202. Deposit a gate metal layer on the semiconductor structure to fill the opening, where the gate metal layer contains impurity. For example, the gate metal layer may be formed on the barrier layer. For example, a material of the gate metal layer may include tungsten, and the impurity may include fluorine.

Step S203. Form an impurity adsorption layer on the gate metal layer. For example, a material of the impurity adsorption layer may include Ti or a TiAl alloy. For example, the thickness of the impurity adsorption layer may fall within a range of 500 Å to 700 Å. For example, the thickness of the impurity adsorption layer may be 550 Å, 600 Å, or 650 Å.

Step S204. Perform a first annealing treatment on a semiconductor structure on which the impurity adsorption layer has been formed, to make the impurity in the gate metal layer enter the impurity adsorption layer.

In some implementations, the first annealing treatment may include a DSA process or a rapid thermal annealing process. In some implementations, a temperature of the first annealing treatment may fall within a range of is 800° C. to 1000° C. For example, the temperature of the first annealing treatment may be 900° C.

Step S205. Remove the impurity adsorption layer after the first annealing treatment is performed. For example, the impurity adsorption layer may be removed by means of a planarization (such as chemical mechanical planarization (CMP) process.

In forms of the manufacturing method described above, the impurity adsorption layer is formed on the gate metal layer after the gate metal layer is formed. Then, the first annealing treatment is performed, to make the impurity in the gate metal layer enter the impurity adsorption layer, and the impurity adsorption layer is removed. Therefore, undesired impurity (such as fluorine) in the gate metal layer can be removed as much as possible, reducing content of the impurity in the metal gate, thereby reducing content of impurity that enters a glue layer from the metal gate.

Further, after the glue layer is subsequently formed, generally, no impurity enters the glue layer from the metal gate to form a void, enabling contact resistance between the metal gate and a subsequently formed gate contact to be relatively low, thereby improving device performance.

In some implementations, in the step of depositing a gate metal layer, the gate metal layer may include: a first part in the opening and a second part on the first part, where the second part is further formed on the interlayer dielectric layer. In some implementations, before the forming an impurity adsorption layer, the manufacturing method may further include: removing a part of the second part by means of a planarization process or an etchback process, so as to thin the second part. By thinning the second part, impurity in the first part of the gate metal layer may enter the impurity adsorption layer as much as possible in a procedure in which the gate metal layer is subsequently removed by using the impurity adsorption layer, so that the impurity is removed as much as possible, reducing the content of the impurity in the metal gate, thereby reducing the content of impurity that enters the glue layer from the metal gate. In this way, contact resistance of the metal gate can be reduced, thereby improving the device performance.

In some implementations, after the part of the second part is removed, the thickness of a remaining part of the second part may fall within a range of 100 Å to 300 Å. For example, the thickness of the remaining part of the second part may be 200 Å.

In some implementations, in the step of removing the impurity adsorption layer (for example, by means of the planarization process), the remaining part of the second part, a part of the interlayer dielectric layer, and a part of the first part are further removed. A remaining part of the first part is used as the gate.

In some implementations of the present disclosure, before performing the first annealing treatment, the manufacturing method may further include: forming an antioxidation layer on the impurity adsorption layer. For example, a material of the antioxidation layer may include TiN. The antioxidation layer may prevent the impurity adsorption layer (such as Ti) from oxidation. In some implementations, the thickness of the antioxidation layer may fall within a range of 20 Å to 50

Å. For example, the thickness of the antioxidation layer may be 30 Å. In some implementations, in the step of removing the impurity adsorption layer, the antioxidation layer is further removed.

In other implementations of the present disclosure, the antioxidation layer may not be generated. For example, an oxidized impurity adsorption layer may be reduced before the impurity adsorption layer (such as Ti) is subsequently removed. In this way, the antioxidation layer does not need to be generated.

Optionally, after removing the impurity adsorption layer, the manufacturing method may further include: forming an insulator layer on the interlayer dielectric layer. Optionally, the manufacturing method may further include: patterning the insulator layer to form a source contact hole exposing the source, a drain contact hole exposing the drain, and a gate contact hole exposing the gate. Optionally, the manufacturing method may further include: forming a glue layer on side walls and the bottom of the source contact hole, the drain contact hole, and the gate contact hole. Optionally, the manufacturing method may further include: performing a second annealing treatment, so that parts of the glue layers on the bottom of the source contact hole and the drain contact hole are respectively combined with surface parts of the source and the drain to form silicide layers. Optionally, the manufacturing method may further include: forming a source contact on the silicide layer of the source contact hole, forming a drain contact on the silicide layer of the drain contact hole, and forming a gate contact on the glue layer of the gate contact hole.

In implementations described above, the glue layer is formed on each of the source, the drain, and the gate, and the silicide layer is formed on the source and the drain by means of the second annealing treatment. Then, the source contact, the drain contact, and the gate contact are formed. Because in the foregoing steps, the impurity (such as the fluorine) in the gate metal layer is removed by using the impurity adsorption layer and the first annealing treatment, and the impurity in the gate is basically not diffused into the glue layer in a process in which the glue layer is formed on the gate and the second annealing treatment is performed, there is basically none void in the glue layer of the gate, enabling the contact resistance between the gate and the gate contact to be relatively low, thereby improving the device performance.

FIG. 3 to FIG. 15 are exemplarily cross-sectional views of a structure of a semiconductor apparatus at several stages in a manufacturing procedure. With reference to FIG. 3 to FIG. 15, the following describes in detail forms of the manufacturing procedure of the semiconductor apparatus.

Figure 3:
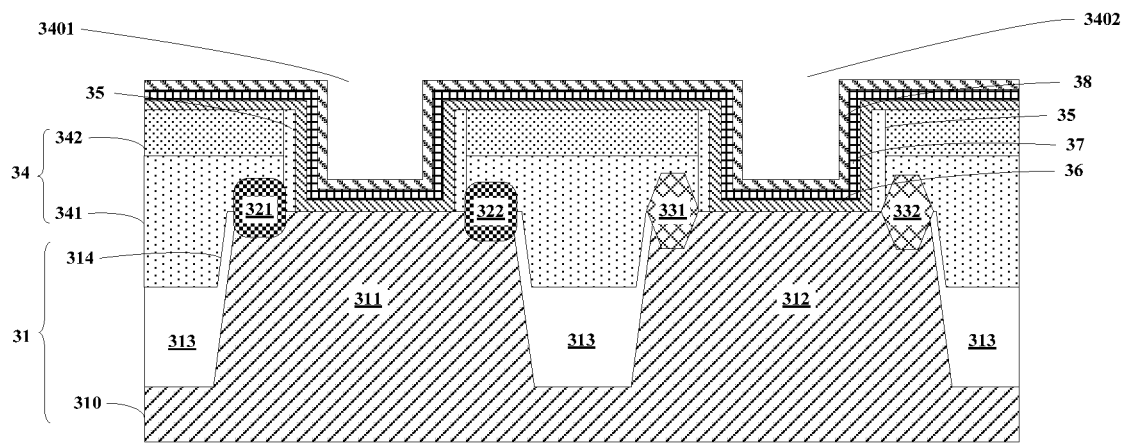
FIG. 3 is an exemplarily cross sectional view of a structure of a semiconductor apparatus at one stage in a manufacturing procedure.

First, as shown in FIG. 3, a semiconductor structure is provided. The semiconductor structure may include: a substrate 31 and an interlayer dielectric layer 34 on the substrate 31. As shown in FIG. 3, the substrate 31 may include: a semiconductor layer (such as silicon) 310, a first semiconductor fin (such as silicon) 311 and a second semiconductor fin (such as silicon) 312 on the semiconductor layer 310, and trench isolation portions 313 on the semiconductor layer 310 around the two semiconductor fins. For example, conductivity types of the first semiconductor fin and the second semiconductor fin may be opposite. For example, the conductivity type of the first semiconductor fin 311 is p-type, used to form an NMOS device; and the conductivity type of the second semiconductor fin 312 is n-type, used to form a PMOS device. The interlayer dielectric layer 34 is formed on the first semiconductor fin 311, the second semiconductor fin 312, and the trench isolation portion 313. The trench isolation portion may include a trench around the semiconductor fin and a trench insulator layer (such as $TiO_2$) that partially fills the trench. In some implementations, the substrate may further include surface coverage layers 314 on partial surfaces of the first semiconductor fin and the second semiconductor fin. For example, a material of the surface coverage layer may be $TiO_2$.

In some implementations, as shown in FIG. 3, the interlayer dielectric layer 34 may include: a first dielectric layer (such as $TiO_2$) 341 that covers the semiconductor fin (such as the first semiconductor fin 311 or the second semiconductor fin 312) and the trench isolation portion 313, and a second dielectric layer (such as silicon nitride) 342 on the first dielectric layer 341. The interlayer dielectric layer 34 has an opening for forming a gate. The opening may expose a partial surface of the substrate 31. For example, the opening may include: a first opening 3401 exposing a partial surface of the first semiconductor fin 311 and a second opening 3402 exposing a partial surface of the second semiconductor fin 312.

In some implementations, as shown in FIG. 3, the semiconductor structure may further include: a spacer layer (such as $TiO_2$ and/or silicon nitride) 35 on side walls of the opening (such as the first opening 3401 and the second opening 3402), an interface layer (such as $TiO_2$) 36 that is on an exposed surface of the substrate in the opening (such as the first opening 3401 and the second opening 3402) and on the side wall of the spacer layer 35, a high-k dielectric layer (such as $HfO_2$ or $TiO_2$) 37 on the interface layer 36, and a barrier layer 38 (such as TiN) on the high-k dielectric layer 37. For example, the interface layer 36 and the high-k dielectric layer 37 may be sequentially formed by means of a deposition process, and the barrier layer 38 is formed by means of an ALD process. In the procedure, as shown in FIG. 3, the interface layer 36, the high-k dielectric layer 37, and the barrier layer 38 may further be formed on the interlayer dielectric layer 34 outside the first opening 3401 and the second opening 3402.

In some implementations, the semiconductor structure may further include: a source and a drain that are respectively on two sides of the opening and at least partially located in the substrate. For example, as shown in FIG. 3, the semiconductor structure may further include: a first source 321 and a first drain 322 that are respectively on two sides of the first opening 3401 and at least partially located in the first semiconductor fin 311, and a second source 331 and a second drain 332 that are respectively on two sides of the second opening 3402 and at least partially located in the second semiconductor fin 312. The interlayer dielectric layer 34 covers the first source 321, the first drain 322, the second source 331, and the second drain 332. Some parts of the spacer layer 35 separate the first opening 3401 from the first source 321 and the first drain 322, and the other parts of the spacer layer 35 separate the second opening 3402 from the second source 331 and the second drain 332.

It should be noted that although FIG. 3 shows two semiconductor fins, and the opening, the source, and the drain that are on/in the interlayer dielectric layer on each semiconductor fin, it should be understood by a person skilled in the art that in some implementations of the present disclosure, there may be only one semiconductor fin or more than two semiconductor fins, and an opening, a source, and a drain that are on/in the interlayer dielectric layer of each semiconductor fin. Therefore, the scope of the present disclosure is not limited thereto.

Figure 4:
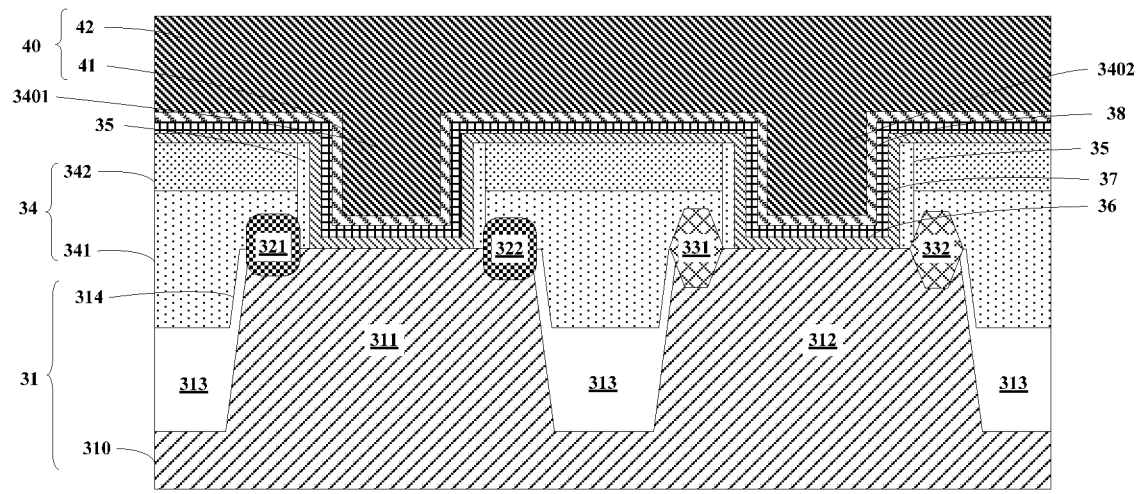
FIG. 4 is an exemplarily cross sectional view of a structure of a semiconductor apparatus at one stage in a manufacturing procedure.

Next, as shown in FIG. 4, for example, a gate metal layer 40 is deposited by means of a deposition process on the semiconductor structure shown in FIG. 3 to fill the opening (such as the first opening 3401 and the second opening 3402). The gate metal layer 40 is formed on the barrier layer 38. In some implementations, a material of the gate metal layer may include tungsten. For example, a nucleation layer of the tungsten may be formed by means of a reaction between $B_2H_6$ and $WF_6$, and then a filling layer of the tungsten is formed by means of a reaction between $H_2$ and $WF_6$ to fill the opening. During the reaction and deposition, the gate metal layer 40 may contain impurity. For example, the impurity may include fluorine.

As shown in FIG. 4, the gate metal layer 40 may include: a first part 41 in the opening (such as the first opening 3401 or the second opening 3402) and a second part 42 on the first part 41. The second part 42 is further formed on the interlayer dielectric layer 34, for example, formed on the barrier layer 38 of the interlayer dielectric layer 34.

Figure 5:
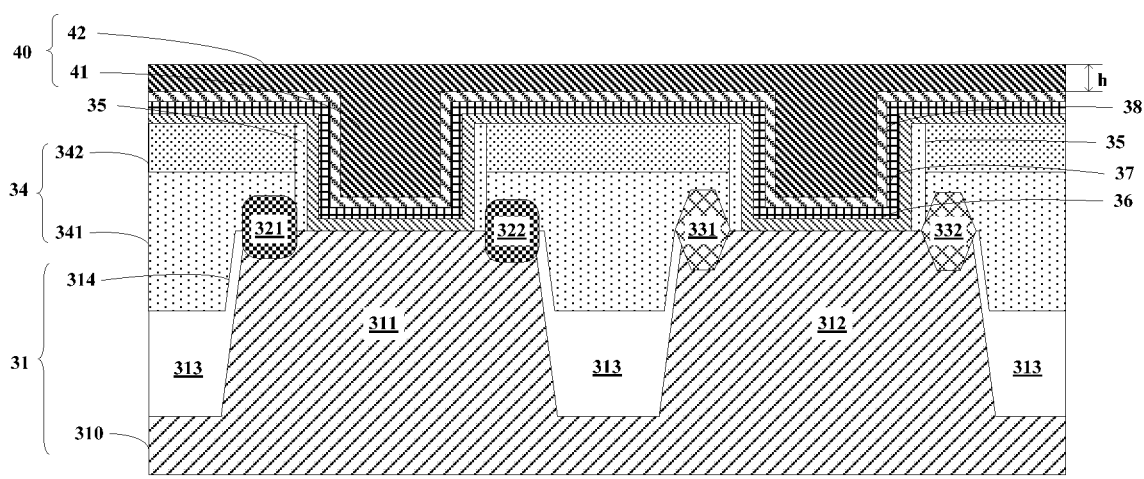
FIG. 5 is an exemplarily cross sectional view of a structure of a semiconductor apparatus at one stage in a manufacturing procedure.

Next, as shown in FIG. 5, a part of the second part 42 is removed by means of a planarization (such as CMP) process or an etchback process, so as to thin the second part 42. For example, the thickness h of a remaining part of the second part 42 may fall within a range of 100 Å to 300 Å. For example, the thickness h of the remaining part of the second part 42 may be 200 Å. By thinning the second part, impurity in the first part of the gate metal layer may enter the impurity adsorption layer as much as possible in a procedure in which the gate metal layer is subsequently removed by using the impurity adsorption layer, so that the impurity is removed as much as possible. In this way, there can be generally no void in a glue layer between the gate and a gate contact, thereby reducing contact resistance of the metal gate, and improving device performance.

Figure 6:
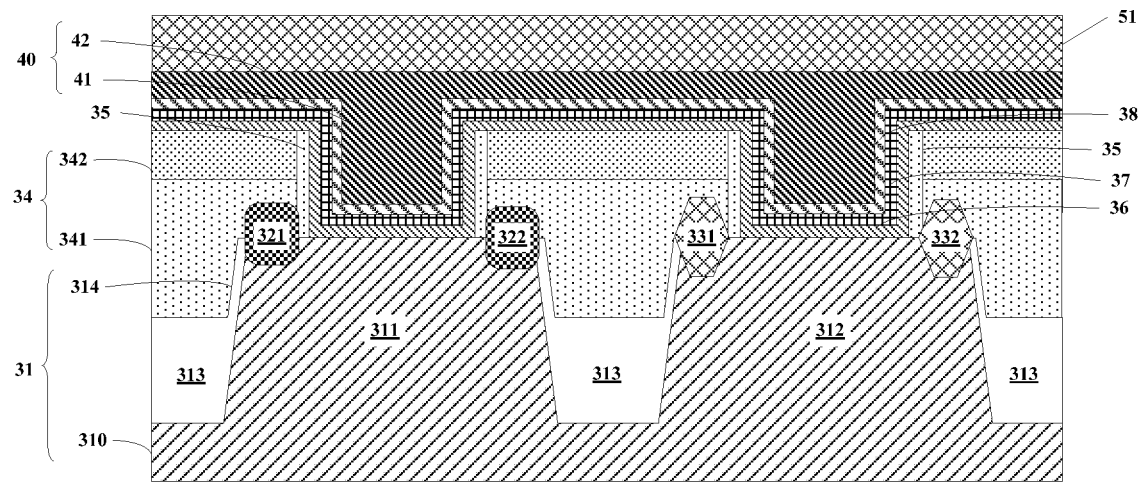
FIG. 6 is an exemplarily cross sectional view of a structure of a semiconductor apparatus at one stage in a manufacturing procedure.

Next, as shown in FIG. 6, for example, an impurity adsorption layer 51 is formed on the gate metal layer 40 by means of a physical vapor deposition (PVD) process or a chemical vapor deposition (CVD) process. For example, a material of the impurity adsorption layer may include Ti or a TiAl alloy. For example, the thickness of the impurity adsorption layer may fall within a range of 500 Å to 700 Å. For example, the thickness of the impurity adsorption layer may be 550 Å, 600 Å, or 650 Å.

Figure 7:
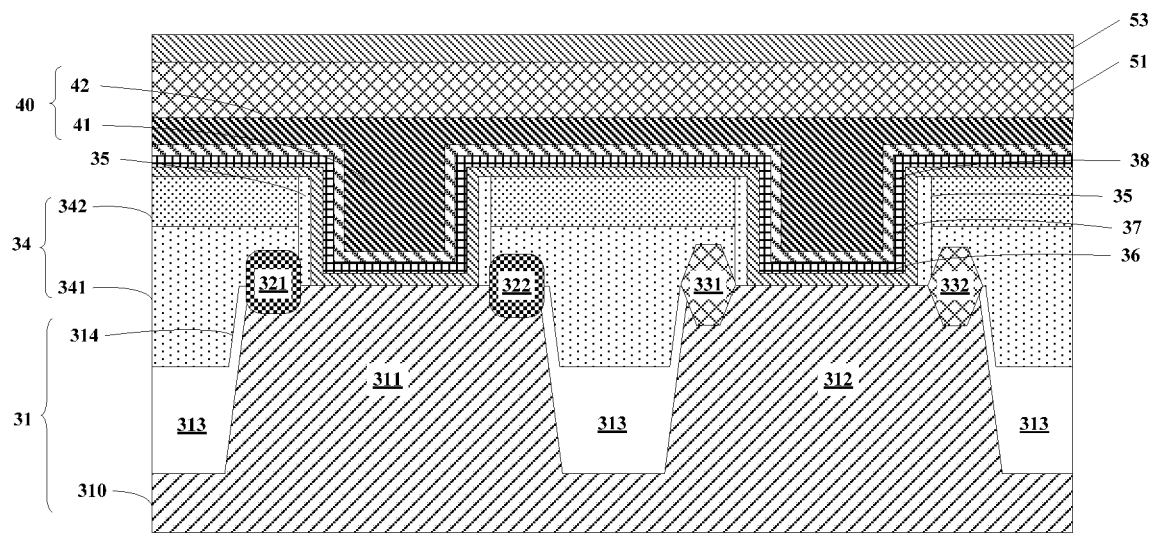
FIG. 7 is an exemplarily cross sectional view of a structure of a semiconductor apparatus at one stage in a manufacturing procedure.

Next, as shown in FIG. 7, for example, an antioxidation layer 53 is formed on the impurity adsorption layer 51 by means of a deposition process. For example, a material of the antioxidation layer 53 may include TiN. The antioxidation layer may prevent the impurity adsorption layer from oxidation. In some implementations, the thickness of the antioxidation layer 53 may fall within a range of 20 Å to 50 Å. For example, the thickness of the antioxidation layer may be 30 Å.

Figure 8:
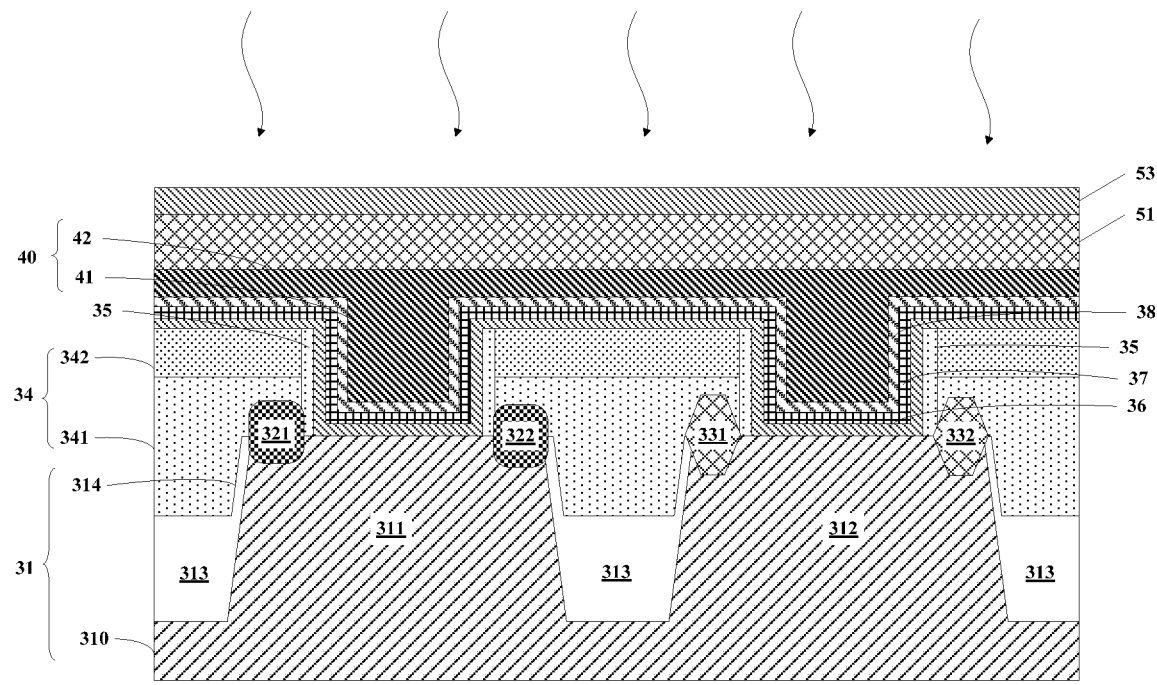
FIG. 8 is an exemplarily cross sectional view of a structure of a semiconductor apparatus at one stage in a manufacturing procedure.

Next, as shown in FIG. 8, a first annealing treatment is performed on a semiconductor structure shown in FIG. 7, to make the impurity in the gate metal layer 40 enter the impurity adsorption layer 51. For example, in the procedure, fluorine impurity in the gate metal layer 40 is combined with Ti in the impurity adsorption layer 51, to form a more stable compound (which may be, for example, a solid or gas, and be easily removed in a subsequent planarization process). Driven by a concentration gradient, the fluorine impurity is absorbed by the impurity adsorption layer.

In some implementations, the first annealing treatment may include: a DSA or rapid thermal annealing process. In some implementations, a temperature of the first annealing treatment may fall within a range of 800° C. to 1000° C. For example, the temperature of the first annealing treatment may be 900° C.

Figure 9:
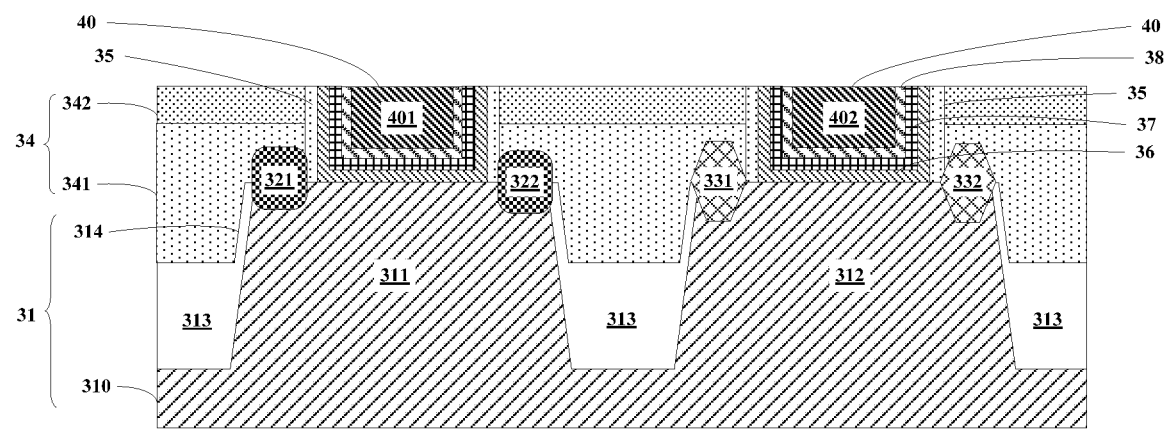
FIG. 9 is an exemplarily cross sectional view of a structure of a semiconductor apparatus at one stage in a manufacturing procedure.

Next, as shown in FIG. 9, planarization (such as CMP) is performed on a semiconductor structure shown in FIG. 8, to remove the antioxidation layer 53, the impurity adsorption layer 51, a remaining part of the second part 42 of the gate metal layer 40, a part (for example, the interlayer dielectric layer may have a loss of approximately 100 Å to meet a process requirement) of the interlayer dielectric layer 34, and a part of the first part 41 of the gate metal layer 40. A remaining part of the first part 41 may be used as the first gate 401 on the first semiconductor fin 311 and the second gate 402 on the second semiconductor fin 312. By means of removal of the impurity adsorption layer (the impurity adsorption layer absorbs the impurity in the gate metal layer), content of undesired impurity in the gate metal layer can be removed, and the impurity may be even removed completely. This helps reduce contact resistance of the metal gate, thereby improving device performance.

Figure 10:
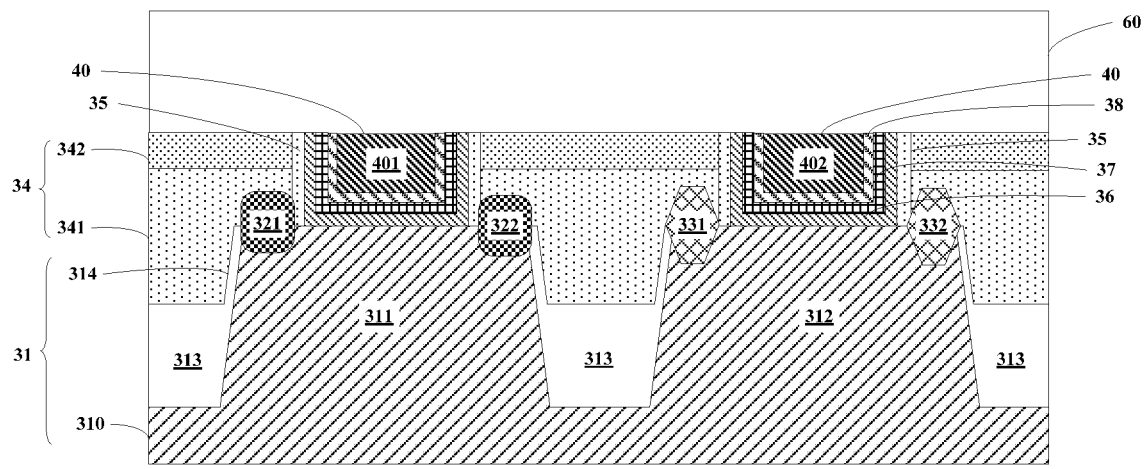
FIG. 10 is an exemplarily cross sectional view of a structure of a semiconductor apparatus at one stage in a manufacturing procedure.

Next, as shown in FIG. 10, for example, an insulator layer (such as $TiO_2$) 60 is formed on the interlayer dielectric layer 34 by means of a deposition process.

Figure 11:
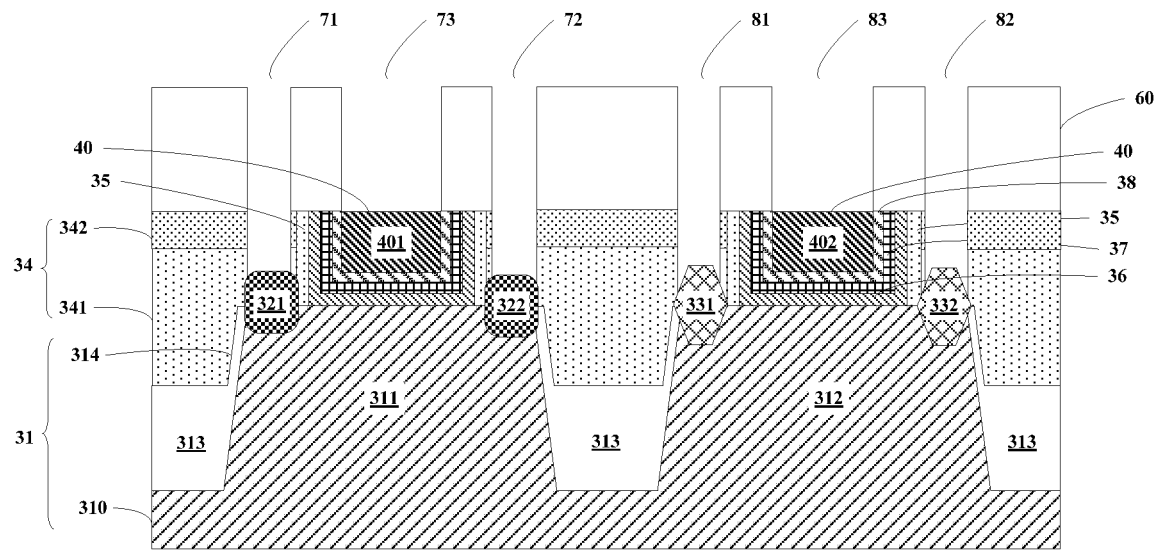
FIG. 11 is an exemplarily cross sectional view of a structure of a semiconductor apparatus at one stage in a manufacturing procedure.

Next, the insulator layer is patterned to form a source contact hole exposing the source, a drain contact hole exposing the drain, and a gate contact hole exposing the gate. For example, as shown in FIG. 11, the insulator layer 60 is patterned to form a first source contact hole 71 exposing the first source 321, a first drain contact hole 72 exposing the first drain 322, a first gate contact hole 73 exposing the first gate 401, a second source contact hole 81 exposing the second source 331, a second drain contact hole 82 exposing the second drain 332, and a second gate contact hole 83 exposing the second gate 402.

Figure 12:
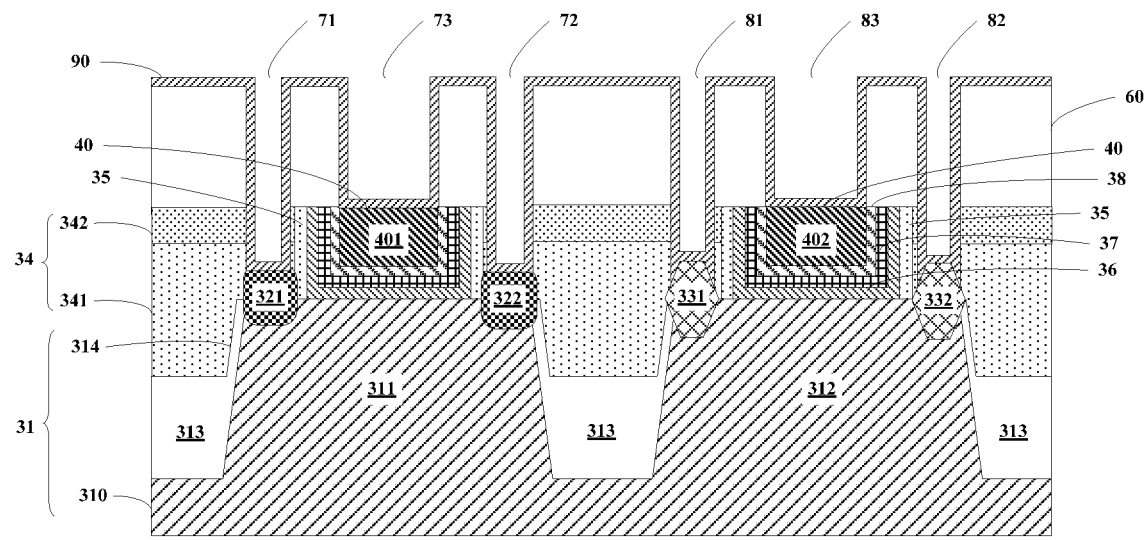
FIG. 12 is an exemplarily cross sectional view of a structure of a semiconductor apparatus at one stage in a manufacturing procedure.

Next, as shown in FIG. 12, for example, a glue layer 90 is formed by means of a deposition process on side walls and the bottom of the source contact hole (such as the first source contact hole 71 and the second source contact hole 81), the drain contact hole (such as the first drain contact hole 72 and the second drain contact hole 82), and the gate contact hole (such as the first gate contact hole 73 and the second gate contact hole 83). The glue layer 90 may further be formed on the insulator layer 60. For example, a material of the glue layer may include: Ti or TiN.

Figure 13:
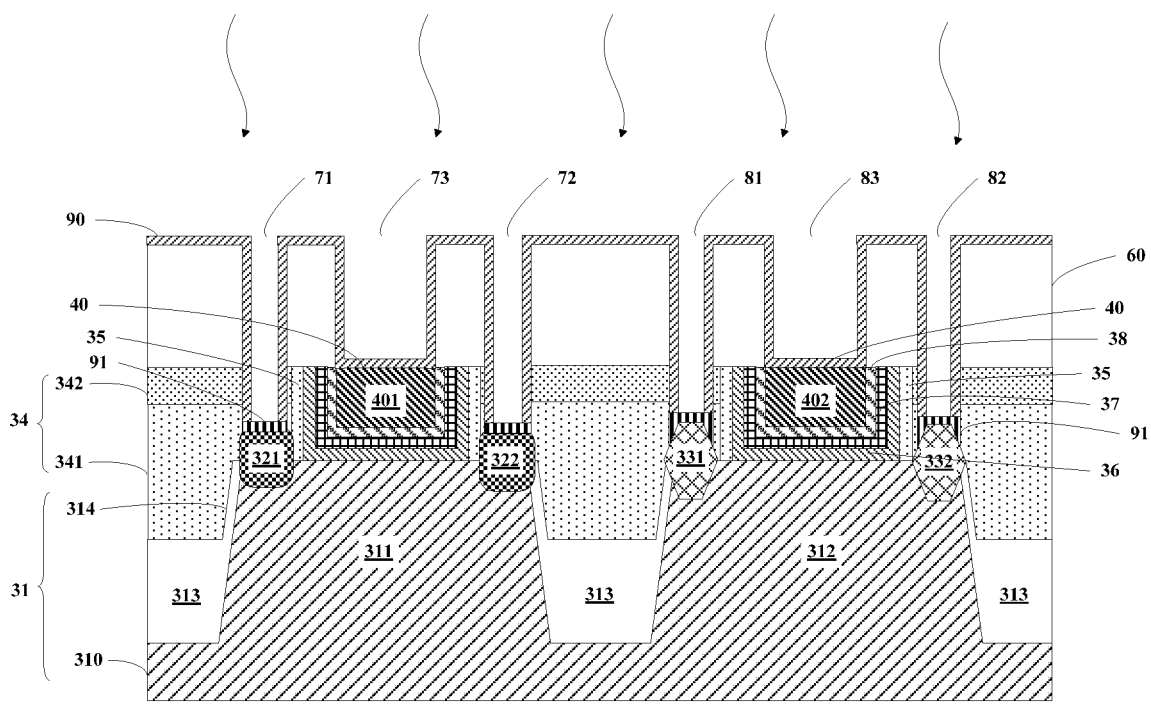
FIG. 13 is an exemplarily cross sectional view of a structure of a semiconductor apparatus at one stage in a manufacturing procedure.

Next, as shown in FIG. 13, a second annealing treatment is performed, so that parts of the glue layers 90 on the bottom of the source contact hole (such as the first source contact hole 71 and the second source contact hole 81) and the drain contact hole (such as the first drain contact hole 72 and the second drain contact hole 82) are respectively combined with surface parts of corresponding sources (such as the first source 321 and the second source 331) and the drains (such as the first drain 322 and the second drain 332) to form silicide layers 91. The silicide layer 91 may be a silicon-titanium compound (such as TiSix). By forming the silicide layer, the source and the drain may respectively achieve an ohmic contact with corresponding contacts that are subsequently formed, thereby reducing contact resistance.

Figure 14:
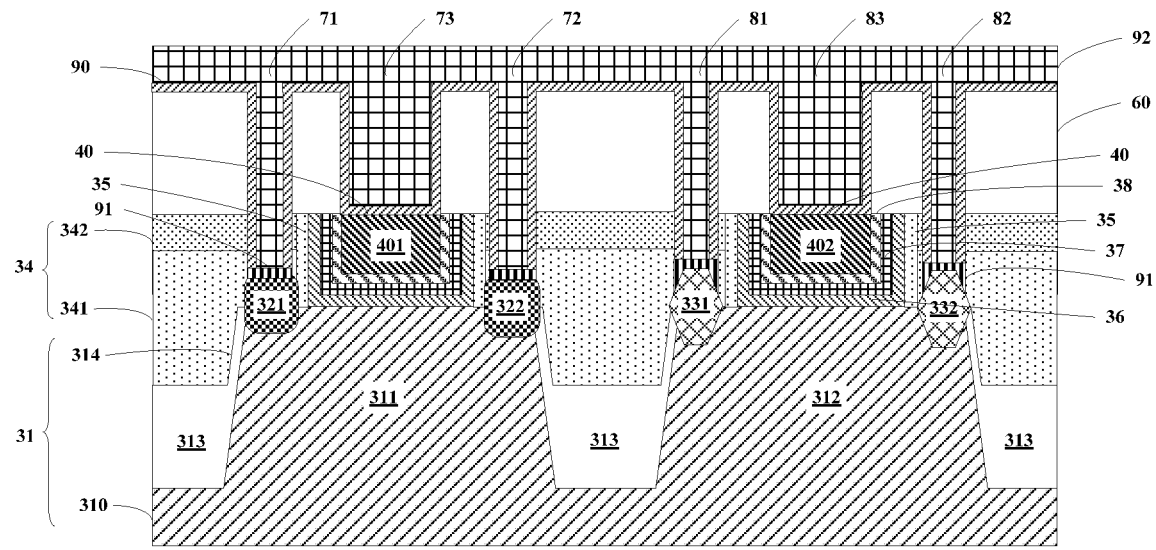
FIG. 14 is an exemplarily cross sectional view of a structure of a semiconductor apparatus at one stage in a manufacturing procedure.
Figure 15:
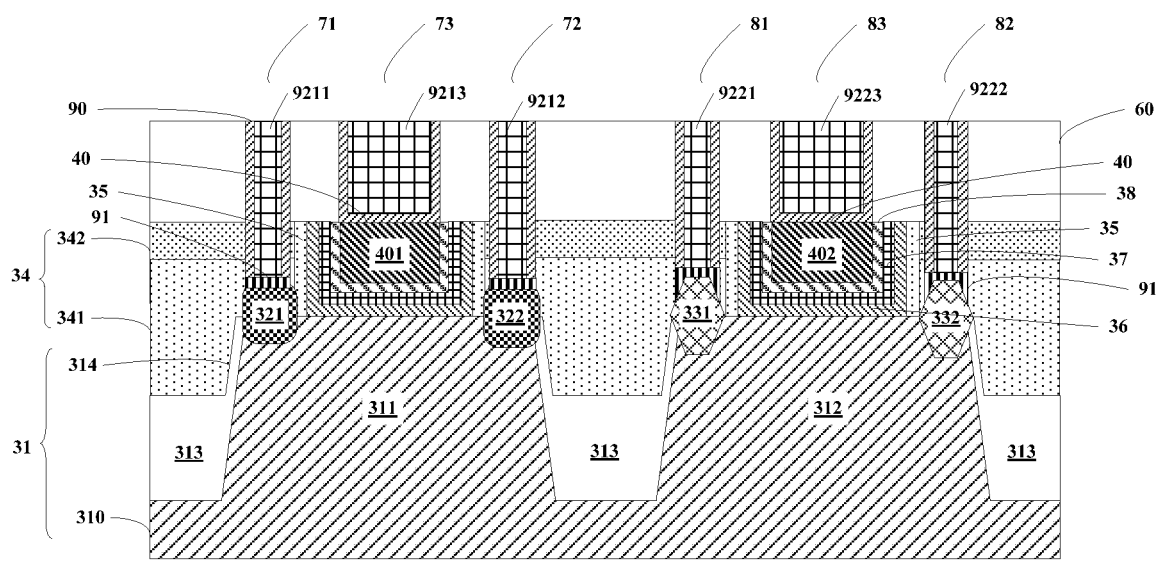
FIG. 15 is an exemplarily cross sectional view of a structure of a semiconductor apparatus at one stage in a manufacturing procedure.

Next, a source contact is formed on the silicide layer of the source contact hole, a drain contact is formed on the silicide layer of the drain contact hole, and a gate contact is formed on the glue layer of the gate contact hole. With reference to FIG. 14 and FIG. 15, the following describes a procedure for forming these contacts.

For example, as shown in FIG. 14, a contact metal layer (such as tungsten) 92 is formed by means of a deposition process on a semiconductor structure shown in FIG. 13, for example. The contact metal layer 92 fills the source contact hole (such as the first source contact hole 71 and the second source contact hole 81), the drain contact hole (such as the first drain contact hole 72 and the second drain contact hole 82), and the gate contact hole (such as the first gate contact hole 73 and the second gate contact hole 83).

Next, as shown in FIG. 15, planarization (such as CMP) is performed on a semiconductor structure shown in FIG. 14, to remove the contact metal layer 92 outside these contact holes and the glue layer 90 outside these contact holes, thereby forming corresponding contacts.

For example, a first source contact 9211 is formed on the silicide layer 91 of the first source contact hole 71, a first drain contact 9212 is formed on the silicide layer 91 of the first drain contact hole 72, a first gate contact 9213 is formed on the silicide layer 91 on the glue layer 90 of the first gate contact hole 73, a second source contact 9221 is formed on the silicide layer 91 of the second source contact hole 81, a second drain contact 9222 is formed on the silicide layer 91 of the second drain contact hole 82, and a second gate contact 9223 is formed on the glue layer 90 of the second gate contact hole 83.

Above, implementations of manufacturing methods for a semiconductor apparatus according to forms of the present disclosure are provided. In implementations of the manufacturing method, the impurity adsorption layer is formed on the gate metal layer after the gate metal layer is formed. Then, the first annealing treatment is performed, to make the impurity in the gate metal layer enter the impurity adsorption layer, and the impurity adsorption layer is removed. Therefore, undesired impurity (such as fluorine) in the gate metal layer can be removed as much as possible, reducing content of the impurity in the metal gate. In this way, after the glue layer is subsequently formed, generally, no impurity enters the glue layer from the metal gate to form a void, enabling contact resistance between the metal gate and the subsequently formed gate contact to be relatively low, thereby improving device performance.

Above, implementations of manufacturing methods for a semiconductor apparatus according to forms of the present disclosure are described in detail. Some details that are well known in the art are not described so as to not obscure the concept of the present disclosure. Based on the above description, a person skilled in the art can thoroughly understand how to implement the technical solutions disclosed herein.

Although some specific embodiments and implementations of the present disclosure have been illustrated in detail by way of examples, it should be understood by a person skilled in the art that the foregoing examples are merely illustrative and are not intended to limit the scope of the present invention. It should be understood by a person skilled in the art that the foregoing embodiments and implementations can be modified without departing from the scope and spirit of the present disclosure. The scope of the present disclosure is defined by the attached claims.

What is claimed is:

1. A manufacturing method for a semiconductor apparatus, comprising:
   providing a semiconductor structure, wherein the semiconductor structure comprises:
      a substrate and an interlayer dielectric layer on the substrate, wherein the interlayer dielectric layer has an opening for forming a gate;
   depositing a gate metal layer on the semiconductor structure to fill the opening entirely, wherein the gate metal layer contains impurity, the gate metal layer comprises a first part in the opening and a second part on the first part, the second part covers a top of the opening, the second part is further formed on the interlayer dielectric layer;
   removing a portion of the second part;
   after removing the portion of the second part, forming an impurity adsorption layer on the gate metal layer;
   performing a first annealing treatment on a semiconductor structure on which the impurity adsorption layer has been formed, to make the impurity in the gate metal layer enter the impurity adsorption layer, wherein a temperature of the first annealing treatment falls within a range of 800° C. to 1000° C.; and
   removing the impurity adsorption layer after the first annealing treatment is performed, wherein a remaining portion of the second part, a portion of the interlayer dielectric layer, and a portion of the first part are further removed, a remaining portion of the first part is used as a metal gate.

2. The method according to claim 1, wherein removing the portion of the second part comprises:
   removing the portion of the second part by means of a planarization process or an etchback process, so as to thin the second part.

3. The method according to claim 2, wherein
after the portion of the second part is removed, a thickness of a remaining portion of the second part falls within a range of 100 Å to 300 Å.

4. The method according to claim 2, wherein:
the impurity adsorption layer is removed by means of the planarization process.

5. The method according to claim 4, wherein:
in the step of providing a semiconductor structure, the semiconductor structure further comprises:
   a source and a drain that are respectively on two sides of the opening and at least partially located in the substrate, wherein the interlayer dielectric layer further covers the source and the drain.

6. The method according to claim 5, further comprising:
forming an insulator layer on the interlayer dielectric layer;
patterning the insulator layer to form a source contact hole exposing the source, a drain contact hole exposing the drain, and a gate contact hole exposing the gate;
forming a glue layer on side walls and the bottom of the source contact hole, the drain contact hole, and the gate contact hole;
performing a second annealing treatment, so that parts of the glue layers on the bottom of the source contact hole and the drain contact hole are respectively combined with surface parts of the source and the drain to form silicide layers; and
forming a source contact on the silicide layer of the source contact hole, forming a drain contact on the silicide layer of the drain contact hole, and forming a gate contact on the glue layer of the gate contact hole.

7. The method according to claim 1, wherein:
a material of the gate metal layer comprises tungsten;
the impurity comprises fluorine; and
a material of the impurity adsorption layer comprises titanium (Ti) or a titanium-aluminum (TiAl) alloy.

8. The method according to claim 1, wherein:
a thickness of the formed impurity adsorption layer falls within a range of 500 Å to 700 Å.

9. The method according to claim 1, wherein:
the first annealing treatment comprises a dynamic surface annealing (DSA) process or a rapid thermal annealing process.

10. The method according to claim 1, wherein:
the method further comprises:
  before performing the first annealing treatment, forming an antioxidation layer on the impurity adsorption layer; and
in the step of removing the impurity adsorption layer, the antioxidation layer is further removed.

11. The method according to claim 10, wherein:
a material of the antioxidation layer comprises TiN.

12. The method according to claim 10, wherein:
a thickness of the antioxidation layer falls within a range of 20 Å to 50 Å.

13. The method according to claim 1, wherein:
the opening exposes a part of a surface of the substrate; and
in the step of providing a semiconductor structure, the semiconductor structure further comprises:
  a spacer layer on a side wall of the opening,
  an interface layer that is on an exposed surface of the substrate in the opening and on the side wall of the spacer layer,
  a high-k dielectric layer on the interface layer, and
  a barrier layer on the high-k dielectric layer,
  wherein the gate metal layer is formed on the barrier layer.

14. The method according to claim 1, wherein:
the substrate comprises:
  a semiconductor layer,
  a semiconductor fin on the semiconductor layer, and
  a trench isolation portion on the semiconductor layer around the semiconductor fin,
wherein the interlayer dielectric layer is formed on the semiconductor fin and the trench isolation portion.

* * * * *